United States Patent [19]

Hirose

[11] Patent Number: 4,816,286
[45] Date of Patent: Mar. 28, 1989

[54] PROCESS FOR SYNTHESIS OF DIAMOND BY CVD

[75] Inventor: Yoichi Hirose, Kitakatsushika, Japan

[73] Assignee: Showa Denko Kabushiki Kaisha, Tokyo, Japan

[21] Appl. No.: 86,770

[22] PCT Filed: Nov. 25, 1986

[86] PCT No.: PCT/JP86/00599

§ 371 Date: Jul. 27, 1987

§ 102(e) Date: Jul. 27, 1987

[87] PCT Pub. No.: WO87/03307

PCT Pub. Date: Jun. 4, 1987

[30] Foreign Application Priority Data

Nov. 25, 1985 [JP] Japan .................... 60-264519

[51] Int. Cl.⁴ .................... B05D 5/12; B01J 3/06; C23C 16/00
[52] U.S. Cl. .................... 427/39; 427/54.1; 427/255.1; 423/446
[58] Field of Search .................... 423/446; 427/39, 54.1, 427/255.1

[56] References Cited

U.S. PATENT DOCUMENTS 3,711,595 1/1973 Margave et al. ............ 423/446
3,749,760 7/1973 Deryagin et al. ............ 423/446

FOREIGN PATENT DOCUMENTS 2034941 1/1971 Fed. Rep. of Germany .
2310251 9/1974 Fed. Rep. of Germany .
0135117 8/1983 Japan .................... 423/446
59-27753 7/1984 Japan .
59-27754 7/1984 Japan .
0186499 9/1985 Japan .................... 423/446
1151096 7/1986 Japan .................... 423/446
0286299 12/1986 Japan .................... 423/446
368384 3/1971 Sweden .
340444 11/1971 Sweden .

Primary Examiner—Michael Lusignan
Assistant Examiner—Margaret Burke
Attorney, Agent, or Firm—Sughrue, Mion, Zinn, Macpeak and Seas

[57] ABSTRACT

A synthesizing process for diamond by the chemical vapor phase growth method, characterized by converting an organic compound containing carbon, hydrogen and at least one of oxygen and nitrogen, to a gas phase, mixing the gas with hydrogen gas, decomposing the mixed gas by an energy of heat, electron beam, light, direct current glow discharge, alternating current glow discharge, or direct current arc discharge, and introducing the decomposed gas to the surface of a heated substrate (5) to deposit diamond on the surface of the substrate.

6 Claims, 4 Drawing Sheets

Table of Reference Numerals and Parts

```
 2 ... heating furnace,
 3 ... substrate supporting stand,
 4 ... reaction tube,
 5 ... substrate,
 6 ... tungsten filament,
14 ... light source,
16 ... plasma generating power source.
```

PROCESS FOR SYNTHESIS OF DIAMOND BY CVD

TECHNICAL FIELD

The present invention relates to a process for the synthesis of diamond by the chemical vapor phase growth method.

BACKGROUND ART

Previously known processes for the synthesis of diamond are classified as follows according to the starting material.

(1) Hydrocarbon is used as the raw material

The chemical vapor phase deposition method for decomposing a gas by an energy of heat, electron beam, plasma or the like to form carbon atoms in an activated state and deposit diamond on a substrate.

(2) Graphite is used as the starting material

1. The ion beam method for forming positive ions of carbon from graphite according to the discharge technique, accelerating and focusing the ions and causing the accelerated and focused ions to impinge against the surface of a substrate to deposit diamond thereon.

2. The chemical transportation method for locating graphite, hydrogen and a substrate in a sealed reaction tube, placing graphite at a high-temperature portion and the substrate at a low-temperature portion, applying an energy of heat or the like to the hydrogen gas to generate atomic hydrogen and depositing diamond on the surface of the substrate.

According to the above-mentioned chemical gas phase deposition method (1), a diamond film can be formed at a growing speed of 0.1 to 3 μm per hour on the surface of the heated substrate if the operation is carried out under a reduced pressure (10 to 100 Torr) at a hydrocarbon concentration of 0.1 to 1.0%. However, this method is defective in that the range of the conditions for the synthesis of diamond is narrow, a deposition of graphite or non-diamond carbon often occurs and the diamond deposition speed is low. Especially, in case of hydrocarbons which consist solely of carbon and hydrogen, the kinds of usable starting materials are limited.

The above-mentioned ion beam method (2)-1 is advantageous in that diamond can be deposited on the surface of the substrate at normal temperature, but is defective in that an ion beam-generating apparatus and a focusing apparatus are expensive, the atom of an inert gas used for the discharge is trapped in the diamond film, and i-carbon is deposited simultaneously with diamond.

Since the above-mentioned chemical transportation method is a closed tube method in which a hydrocarbon formed by the reaction between graphite and atomic hydrogen in the closed tube is utilized, a continuous operation is impossible and the thickness of a diamond film that can be synthesized is limited. The method is also defective in that the diamond synthesis conditions such as the concentration of the reaction gases and the heating temperature cannot be independently controlled.

In the process disclosed in Japanese Examined Patent Publications No. 59-27753 and No. 59-27754, in which diamond is synthesized by using hydrogen and a hydrocarbon alone, the kinds of applicable starting gases are extremely limited, and the gases that can be practically used are methane, ethane, and ethylene alone.

DISCLOSURE OF THE INVENTION

It is an object of the present invention to obviate the above-mentioned defects of the conventional methods and provide a process for the synthesis of diamond in which the range of the diamond synthesis conditions is broad, the apparatus and starting material used are not expensive, a great number of kinds of gases can be used as the starting gas, and diamond having a high quality can be obtained at a high deposition speed.

According to the present invention, an organic compound containing oxygen and/or nitrogen in addition to carbon and hydrogen (sometimes referred to merely as "organic compound" hereinafter) is converted to a gas phase and mixed with hydrogen gas, the mixed gas is decomposed by an energy of heat, electron beam, light, or plasma of a direct current glow discharge, or an alternating or direct current arc discharge, to form a methyl group and atomic hydrogen, and the decomposed gas is introduced to the surface of a substrate heated at 500° to 900° C. to deposit diamond thereon, whereby the above-mentioned object can be attained. Namely, the most significant feature of the present invention resides in a discovery of an appropriate condition for synthetizing diamond with a combination of a starting material which consists of an organic compound containing an oxygen or nitrogen atom (the above-mentioned, methanol, ethanol, acetone, methylamine and the like) and an energy-imparting means.

Typical organic compounds that can be used in the present invention are described below.

(I) O-Containing Organic Compounds
Alcohol group (—OH)
$C_2H_2OH$:ethanol
$CH_3OH$:methanol
$(CH_3)_2CHOH$:2-propanol
$(CH_3)_3COH$:2-methyl-2-propanol
$CH_3—CH_2—CH_2OH$:1-propanol
$(CH_3)_2—C(OH)CH_2COCH_3$:diacetone alcohol
$CH_2=CHCH_2OH$:allyl alcohol
Ether group (—O—)
$CH_3OCH_3$:dimethyl ether
$CH_3CH_2—O—CH=CH_2$:ethoxyethylene
$CH_3—O—CH_2CH_3$:ethylmethyl ether
$(CH_3CH_2)_2O$:diethyl ether

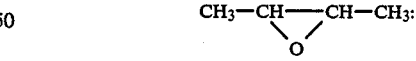

2,3-epoxybutane
$(CH_3COO)_2O$:acetyl ether
Ketone group (C=O)
$CH_3COCH_3$:acetone
(II) N-Containing Organic Compounds
Amine ($RNH_2$)
$CH_3NH_2$:methylamine
$CH_3CH_2NH_2$:ethylamine
$(CH_3)_2NH$:dimethylamine
$(CH_3)_3N$:trimethylamine
$(CH_3)_2CHNH_2$:isopropylamine
$CH_3COC_2H_5$:ethylmethyl ketone
$C_2H_5COC_2H_5$:diethyl ketone
$CH_3COCH_2COCH_3$:2,4-pentane-dione
$C_6H_5COCH_3$:acetophenone
$C_{10}H_7COCH_2CH_2CH_3$:1'-butyronaphthone Ester (RCOOR')
$CH_3COOCH_3$:methyl acetate
$CH_3COOC_2H_5$:ethyl acetate
$CH_3COOC_5H_{11}$:isoamyl acetate
Ketene group
$(CH_3)_2C=CO$:dimethyl ketene
$C_6H_5-CH=CO$:phenyl ketene
Acetyl group $(CH_3CO-)$
$CH_3COOH$:acetic acid
$(CH_3CO)_2O$:acetic anhydride
$CH_3COC_6H_5$:acetophenone
$(CH_3CO)_2$:biacetyl
Aldehyde group (—CHO)
HCHO:formaldehyde
$CH_3CHO$:acetaldehyde
$C_2H_3CH_2CHO$:propionaldehyde

| Peroxide bonding (—O—O—) | |
|---|---|
| $(CH_3)_3COOH$ | tert-butyl hydroxyperoxide |
| $((CH_3)_3CO)_2$ | di-tert-butylperoxide |
| $CH_3OOH$ | methyl hydroxyperoxide |
| $(CH_3)_3COOCOCH_3$ | tert-butyl peroxide acetate |
| $(CH_3)_2CHOOCH_3$ | isopropyl methyl peroxide |
| $CH_3COOC_2H_5$ | methyl ethyl ketone peroxide |
| $CH_3COOOH$ | peracetic acid |

$CH_3COCH_3$:acetone
(II) N-Containing Organic Compounds
Amine $(RNH_2)$
$CH_3NH_2$:methylamine
$CH_3CH_2NH_2$:ethylamine
$(CH_3)_2NH$:dimethylamine
$(CH_3)_3N$:trimethylamine
$(CH_3)_2CHNH_2$:isopropylamine
Nitrile group
$CH_3CN$:acetonitrile
$C_6H_5CN$:benzonitrile
$CH_2=CHCN$:acrylonitrile
$(CH_3)_3CCN$:pivalonitrile
Amide group
$CH_3(CH_2)_4C-NH_2$:hexanamide
$CH_3CONH_2$:acetamide
Nitro group
$C_2H_5NO_2$:nitroethane
$CH_3NO_2$:nitromethane
$C_6H_5NO_2$:nitrosobenzene
$C_3H_7NO_2$:nitropropane The present invention is divided into two aspects according to the organic compound used.

It is considered that the principle of the process of the present invention is probably as follows.

In the present invention, a mixed gas of an organic compound as mentioned above and hydrogen is decomposed by an energy of heat, electron beam, light, plasma of a glow discharge, or plasma of a direct or alternating current arc discharge (hereinafter referred to as the plasma) to generate a methyl group and atomic hydrogen. This methyl group maintains a diamond type structure on the heated substrate surface and prevents double and triple bonds of other carbon atoms. Atomic hydrogen is bonded with graphite or non-diamond carbon to form a hydrocarbon and the atomic hydrogen is removed in the form of the hydrocarbon. Accordingly, the atomic hydrogen exerts a function of cleaning the substrate surface.

In order to synthesize diamond under temperature and pressure conditions at which graphite is thermodynamically stable, it is necessary to maintain the active states of the chemically active methyl group and atomic hydrogen. Furthermore, in order to form a diamond film, it is necessary to supply a reaction energy sufficient to produce a diamond type structure.

In the process of the present invention, in order to prevent a deposition of graphite or non-diamond carbon, preferably the mixing ratio of the organic compound/hydrogen is not more than 1, and in order to synthesize granular or filmy diamond, it is especially preferred that the above-mentioned mixing ratio be not more than 0.04.

In order to form a methyl group and atomic hydrogen by thermal decomposition, preferably the temperature of a heating member is at least 1500° C., more preferably from 2000° to 2800° C. As the heating member, there can be mentioned, for example, filaments of tungsten, molybdenum, tantalum and alloys thereof.

The pressure in the reaction tube where the substrate is placed is 0.01 to 1000 Torr, preferably 100 to 800 Torr.

In order to form a methyl group and atomic hydrogen by decomposition by electron beam, the current density of the electron beam applied to the surface of the substrate is at least 1 mA/cm².

In order to form a methyl group and atomic hydrogen by decomposition by light, preferably the wavelength of the light is not more than 600 nm, especially not more than 350 nm for the methyl group, and not more than 85 nm.

In order to form a methyl group and atomic hydrogen by decomposition by plasma, preferably the power density of discharge is not less than 1 W/cm².

An ordinary direct current or alternating current high frequency or microwave plasma discharge can be used for decomposition by plasma.

BEST MODE FOR CARRYING OUT THE INVENTION

Figure 1:
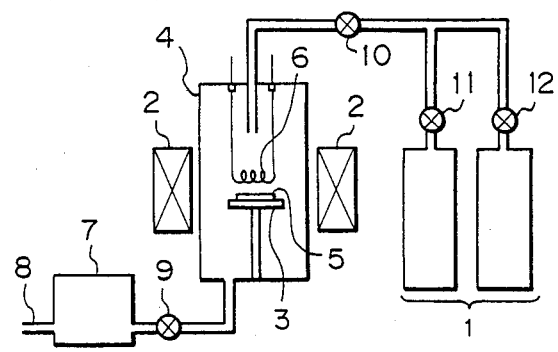
FIG. 1 is a systematic diagram illustrating an example of the apparatus for synthesizing diamond by thermal decomposition according to the process of the present invention.
Figure 2:
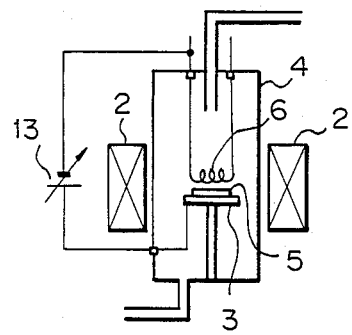
FIG. 2 is a diagram illustrating a main part of an example of the apparatus for synthesizing diamond by electron beam decomposition according to the process of the present invention.
Figure 3:
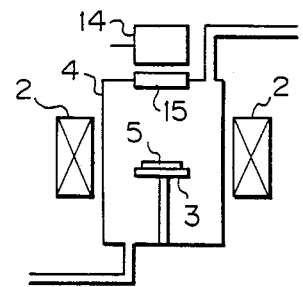
FIG. 3 is a diagram illustrating a main part of an example of the apparatus for synthesizing diamond by light decomposition according to the process of the present invention.
Figure 4:
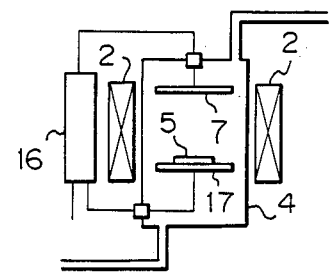
FIG. 4 is a diagram illustrating a main part of an example of the apparatus for synthesizing diamond by plasma decomposition according to the process of the present invention.

FIGS. 1 through 4 illustrate examples of the apparatus for synthesizing diamond according to the process of the present invention. More specifically, FIG. 1 is a systematic view of the process utilizing the thermal decomposition, FIG. 2 is a view showing a main part in the process utilizing the decomposition by electron beam, FIG. 3 is a diagram illustrating a main part in the process utilizing the light decomposition, and FIG. 4 is a diagram illustrating a main part in the process utilizing the plasma decomposition.

In FIG. 1, reference numeral 1 represents a device for supplying an organic compound and hydrogen, reference numeral 2 represents a heating furnace, reference numeral 3 represents a substrate supporting stand, reference numeral 4 represents a reaction tube, reference numeral 5 represents a substrate, reference numeral 6 represents a tungsten filament, reference numeral 7 represents an exhaust apparatus, reference numeral 8 represents an exhaust opening, and each of reference numerals 9, 10, 11, and 12 represents a cock. At first, the substrate 5 is set on the substrate supporting stand 3 in the reaction tube 4, and air in the reaction tube 4 is removed by the exhaust device 7. Then the concentration and flow rate of the mixed gas are adjusted by the cocks 10, 11 and 12, the mixed gas is introduced into the reaction tube 4, and the pressure in the reaction tube 4 is maintained at a predetermined level by the cock 9. The mixed gas is introduced into the reaction tube 4 from the upper portion and is passed through the tungsten filament 6 located in the vicinity of the substrate supporting stand 3, and the mixed gas is supplied to the surface of the substrate 5. The heating furnace 2 and tungsten filament 6 are heated to predetermined temperatures.

A body of metal, e.g., Si or the like, of sintered ceramic, e.g., SiC, or a granular SiC or the like, is used as the substrate 5.

FIG. 2 illustrates the surrounding portion of the reaction tube 4; the other portion is omitted. In FIG. 2, reference numeral 13 represents a direct current power source for generating the electron beam between the tungsten filament 16 and the substrate.

The same members as the members shown in FIG. 1 are represented by the same reference numerals. In FIG. 3, reference numeral 14 represents a light source and reference numeral 15 represents a light transmitting window, and in FIG. 4, reference numeral 16 represents a plasma generating power source and reference numeral 17 represents an electrode.

EXAMPLE 1

Figure 5:
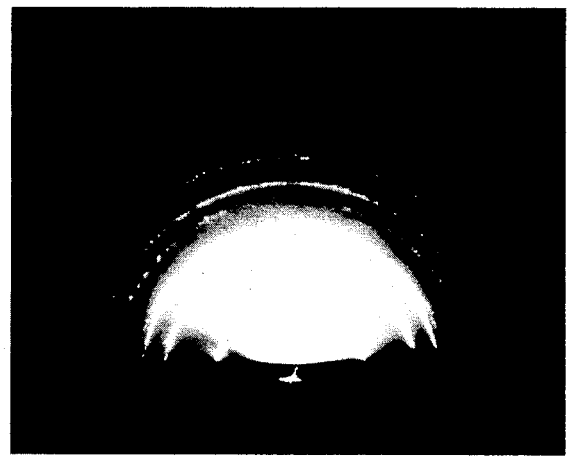
FIG. 5 is a photograph showing the reflection electron beam diffraction pattern of diamond obtained in Example 1 of the first aspect of the present invention.
Figure 6:
FIGS. 6 and 7 are scanning type electron microscope photographs of the surface and section of diamond obtained in Example 1 of the first aspect of the present invention; and, FIG. 8 is a scanning type electron microscope photograph of granular diamond obtained in Example 3 of the first aspect of the present invention.
Figure 7:
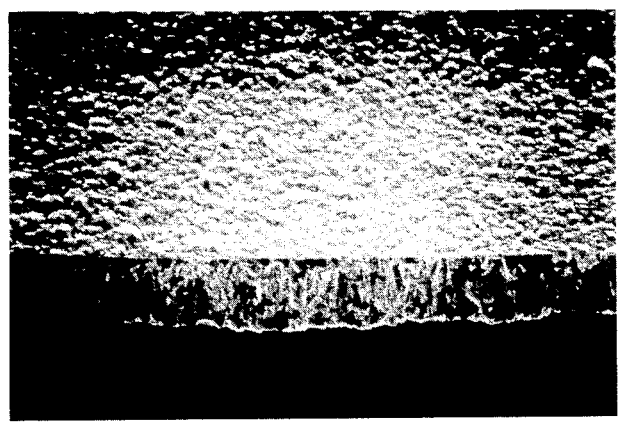

A surface-polished silicon wafer was used as the substrate 5 and a gaseous mixture comprising acetone ($CH_3COCH_3$) and hydrogen at a ratio of 1:50 (volume ratio) was used as the reaction gas. The pressure in the reaction tube 4 was adjusted to 100 Torr. The substrate was heated to 650° C. and the tungsten filament 6 was heated to 2000° C., and the growth was carried out for 1 hour. A deposition of filmy diamond having a thickness of about 20 $\mu$m on the substrate 5 was observed. The Vickers hardness of the obtained filmy diamond was 9500 to 12000 kg/mm$^2$, which is substantially equal to the value of natural diamond. A reflection electron beam refraction pattern of the filmy diamond is shown in FIG. 5. From this diffraction pattern, it was identified that the filmy diamond was cubic diamond. FIG. 6 is a scanning electron microscope photograph showing the surface of the filmy diamond and FIG. 7 is a scanning type electron microscope photograph showing the section of the filmy diamond.

EXAMPLE 2

A surface-polished silicon wafer was used as the substrate 5 and a gaseous mixture comprising acetone ($CH_3COCH_3$) and hydrogen at a mixing ratio 1:100 (volume ratio) was used as the reaction gas. The pressure in the reaction tube 4 was adjusted to 760 Torr (atmospheric pressure) and the growth was carried out for 1 hour at a substrate temperature of 600° C. while the tungsten filament 6 for the thermal decomposition was heated to 2000° C. A deposition of filmy diamond having a thickness of about 20 $\mu$m on the substrate 5 was observed.

EXAMPLE 3

Figure 8:
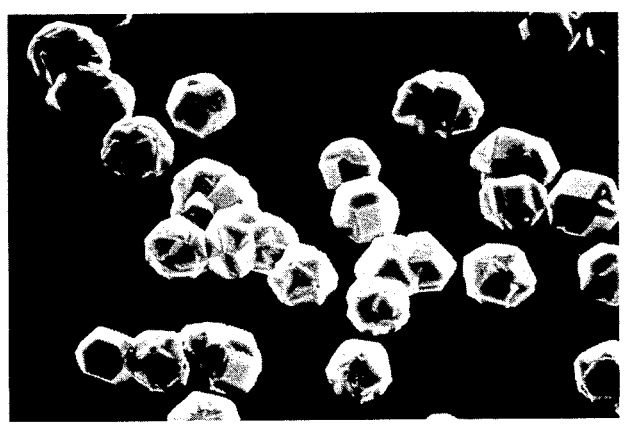

A mirror-polished silicon wafer was used as the substrate 5 and a gaseous mixture comprising acetone ($CH_3COCH_3$) and hydrogen at a mixing ratio of 1:100 (volume ratio) was used as the reaction gas. The pressure in the reaction tube 4 was adjusted to 100 Torr and the growth was carried out for 1 hour at a substrate temperature of 650° C. while the tungsten filament 6 was heated to a temperature of 2000° C. A deposition of granular diamond having a particle size of about 20 $\mu$m on the substrate 5 was observed. FIG. 8 is a scanning type electron microscope photograph of the obtained granular diamond.

EXAMPLE 4

A surface-polished silicon wafer was used as the substrate 5 and a gaseous mixture comprising methyl acetate ($CH_3COOCH_3$) and hydrogen at a mixing ratio of 1:500 (volume ratio) was used as the reaction gas. The pressure in the reaction tube 4 was adjusted to 50 Torr and the substrate temperature was adjusted to 750° C., and the growth was carried out for 1 hour while the tungsten filament 6 was heated to a temperature of 2000° C. A deposition of filmy diamond having a thickness of about 10 $\mu$m on the substrate 5 was observed.

EXAMPLE 5

A surface-polished silicon wafer was used as the substrate 5 and a gaseous mixture comprising methanol ($CH_3OH$) and hydrogen at a mixing ratio of 1:100 (volume ratio) was used as the reaction gas. The pressure in the reaction tube 4 was adjusted to 50 Torr and the substrate temperature was adjusted to 700° C. The growth was carried out for 1 hour while the tungsten filament 6 was heated to a temperature of 2000° C. A deposition of filmy diamond having a thickness of about 3 $\mu$m on the substrate 5 was observed.

EXAMPLE 6

A surface-polished silicon wafer was used as the substrate 5 and a gaseous mixture comprising ethanol ($C_2H_5OH$) and hydrogen at a mixing ratio of 1:500 (volume ratio) was used as the reaction gas. The pressure in the reaction tube 4 was adjusted to 40 Torr and the substrate temperature was adjusted to 600° C. The growth was carried out for 1 hour while the tungsten filament 6 was heated to a temperature of 2000° C. A deposition of filmy diamond having a thickness of about 5 $\mu$m on the substrate 5 was observed.

EXAMPLE 7

A surface-polished silicon wafer was used as the substrate 5 and a gaseous mixture comprising trimethylamine [$(CH_3)_3N$] and hydrogen at a mixing ratio of 1:100 (volume ratio) was used as the reaction gas. The pressure in the reaction tube was adjusted to 50 Torr and the substrate temperature was adjusted to 650° C. The growth was carried out for 1 hour while the tungsten filament 6 was heated to a temperature of 2000° C. A deposition of filmy diamond having a thickness of about 3 μm on the substrate 5 was observed.

EXAMPLE 8

The same apparatus as in Examples 1 through 7 was used to produce diamond, while varying conditions such as the kinds and flow rates of gases for producing diamond, the substrate temperature, filament temperature, and the like. The flow speed of the gases is shown in Table 1 in ( ) and by units of SCCM (ditto, hereinafter).

irradiated with an electron beam at a current density of 10 mA/cm$^2$ and the growth was carried out for 1 hour. A deposition of filmy diamond having a thickness of about 2-3 μm on the substrate 5 was observed.

EXAMPLE 10

A surface-polished silicon wafer was used as the substrate 5 shown in FIG. 2 and a gaseous mixture comprising acetone ($CH_3COCH_3$) and hydrogen at a mixing ratio of 1:100 (volume ratio) was used as the reaction gas. The pressure in the reaction tube 4 was adjusted to 50 Torr and the substrate temperature was adjusted to 750° C., and the tungsten filament 6 was heated at 2000° C. The surface of the substrate 5 was irradiated with an electron beam at a current density of 10 mA/cm$^2$ and the growth was carried out for 1 hour. A deposition of

TABLE 1

| | | Production Conditions | | | | Results |
|---|---|---|---|---|---|---|
| Sample No. | Kinds and Flow Rates of Gases | Volume Proportion of Organic Compound Gases to Hydrogen Gas | Substrate Temperature (°C.) | Pressure of Reaction Gases (Torr) | Temperature of Filament (°C.) | Deposition Speed of Diamond (μm/hr) |
| 1 | $H_2$(200) $CH_3COCH_3$(4) | 0.02 | 650 | 100 | 2000 | 20 |
| 2 | $H_2$(100) $CH_3COCH_3$(1) | 0.01 | 600 | 760 | 2000 | 20 |
| 3 | $H_2$(500) $CH_3COOCH_3$(1) | 0.002 | 750 | 50 | 2000 | 10 |
| 4 | $H_2$(100) $CH_3OH$(1) | 0.01 | 700 | 50 | 2000 | 6 |
| 5 | $H_2$(500) $C_2H_5OH$(1) | 0.002 | 600 | 40 | 2000 | 10 |
| 6 | $H_2$(100) $CH_3CHO$(1) | 0.01 | 750 | 200 | 2300 | 15 |
| 7 | $H_2$(200) $(CH_3)_2CHOH$(4) | 0.02 | 800 | 760 | 2500 | 18 |
| 8 | $H_2$(100) $[(CH_3)_2CH]_2O$(2) | 0.02 | 700 | 100 | 2200 | 14 |
| 9 | $H_2$(300) $C_2H_5OC_2H_5$(15) | 0.05 | 750 | 760 | 2300 | 23 |
| 10 | $H_2$(100) $[(CH_3)_3CO]_2$(2) | 0.02 | 750 | 760 | 2500 | 28 |
| 11 | $H_2$(100) $(CH_3)_3N$(1) | 0.01 | 650 | 50 | 2000 | 6 |
| 12 | $H_2$(100) $CH_3NH_2$(2) | 0.02 | 700 | 200 | 2300 | 10 |
| 13 | $H_2$(100) $CH_3NNCH_3$(1) | 0.01 | 650 | 50 | 2000 | 7 |
| 14 | $H_2$(100) $CH_3CONH_2$(1) | 0.01 | 650 | 100 | 2000 | 8 |

EXAMPLE 9

A surface-polished silicon wafer was used as the substrate 5 shown in FIG. 2 and a gaseous mixture comprising acetone trimethylamine [$(CH_3)_3N$] and hydrogen at a mixing ratio of 1:100 (volume ratio) was used as the reaction gas. The pressure in the reaction tube 4 was adjusted to 50 Torr and the substrate temperature was adjusted to 550° C., and the tungsten filament 6 was heated at 2000° C. The surface of the substrate 5 was filmy diamond having a thickness of about 25 μm on the substrate 5 was observed.

EXAMPLE 11

The same apparatus as in Examples 9 and 10 was used to produce diamond, while varying conditions such as the kinds and flow rates of gases for producing diamond, the substrate temperature, pressure of reaction gas, current density, and the like.

TABLE 2

| | | Production Conditions | | | | Results |
|---|---|---|---|---|---|---|
| Sample No. | Kinds and Flow Rates of Gases | Volume Proportion of Organic Compound Gases to Hydrogen Gas | Substrate Temperature (°C.) | Pressure of Reaction Gases (Torr) | Current Density (Am/cm$^2$) | Deposition Speed of Diamond (μm/hr) |
| 15 | $H_2$(100) $CH_3COCH_3$(1) | 0.01 | 750 | 50 | 10 | 25 |
| 16 | $H_2$(100) $CH_3COCH_3$(2) | 0.02 | 650 | 760 | 30 | 25 |
| 17 | $H_2$(100) $CH_3COCH_3$(2) | 0.02 | 700 | 200 | 100 | 35 |
| 18 | $H_2$(200) $CH_3OH$(10) | 0.05 | 650 | 100 | 10 | 20 |
| 19 | $H_2$(100) | 0.01 | 650 | 100 | 200 | 32 |

TABLE 2-continued

| Sample No. | Kinds and Flow Rates of Gases | Production Conditions | | | | Results |
|---|---|---|---|---|---|---|
| | | Volume Proportion of Organic Compound Gases to Hydrogen Gas | Substrate Temperature (°C.) | Pressure of Reaction Gases (Torr) | Current Density (Am/cm$^2$) | Deposition Speed of Diamond (μm/hr) |
| 20 | $CH_3CHO(1)$ $H_2(100)$ | 0.02 | 700 | 200 | 300 | 35 |
| 21 | $[(CH_3)_3CO]_2(2)$ $H_2(100)$ | 0.02 | 750 | 200 | 500 | 43 |
| 22 | $[(CH_3)_3CO](2)$ $H_2(100)$ | 0.01 | 550 | 100 | 10 | 8 |
| 23 | $(CH_3)_3N(1)$ $H_2(100)$ | 0.01 | 650 | 50 | 30 | 12 |
| 24 | $(CH_3)_2NH(1)$ $H_2(100)$ | 0.04 | 700 | 200 | 10 | 8 |
| 25 | $CH_3NH(4)$ $H_2(100)$ | 0.02 | 700 | 200 | 10 | 7 |
| 26 | $CH_3CONH_2(2)$ $H_2(100)$ | 0.03 | 600 | 760 | 50 | 17 |
| 27 | $CH_3COC_2H_5(3)$ $H_2(100)$ | 0.01 | 650 | 200 | 200 | 28 |
| 28 | $CH_3OCH_3(1)$ $H_2(100)$ | 0.01 | 700 | 200 | 300 | 30 |
| 29 | $(CH_3CO)_2O(1)$ $H_2(400)$ | 0.03 | 700 | 100 | 150 | 27 |
| 30 | $CH_3OOH(12)$ $H_2(300)$ $(CH_3)_3COOH(6)$ | 0.02 | 750 | 300 | 300 | 43 |

EXAMPLE 12

A surface-polished silicon wafer was used as the substrate 5 shown in FIG. 3, and diamond was produced under the conditions as shown in Table 3. Note, two kinds of lamps were used as the light source 14.

TABLE 3

| Sample No. | Kinds and Flow Rates of Gases | Production Conditions | | | | | Results |
|---|---|---|---|---|---|---|---|
| | | Volume Proportion of Organic Compound Gases to Hydrogen Gas | Substrate Temperature (°C.) | Pressure of Reaction Gases (Torr) | Kind of Light Source or Light | Power of Light Source (W) | Deposition Speed of Diamond (μm/hr) |
| 31 | $H_2(100)$ $CH_3COCH_3(5)$ $Hg(0.1)$ | 0.05 | 650 | 10 | Mercury Lamp Xenon Lamp | 100 350 | 2.4 |
| 32 | $H_2(100)$ $CH_3COCH_3(2)$ $Ar(3)$ | 0.02 | 700 | 50 | Mercury Lamp Heavy Hydrogen Lamp | 110 200 | 1.5 |
| 33 | $H_2(50)$ $CH_3COCH_3(2)$ | 0.04 | 600 | 30 | Mercury Lamp Argon Resonance Lamp | 110 24 | 0.3 |
| 34 | $H_2(100)$ $CH_3COCH_3(3)$ $Xe(3)$ | 0.04 | 650 | 100 | Mercury Lamp Heavy Hydrogen Lamp | 110 200 | 3.5 |
| 35 | $H_2(50)$ $CH_3COCH_3(3)$ $C_2H_2(30)$ | 0.06 | 600 | 50 | Mercury Lamp Heavy Hydrogen Lamp | 110 200 | 0.8 |
| 36 | $H_2(50)$ $CH_3COCH_3(2)$ $NH_3(50)$ | 0.04 | 650 | 10 | Mercury Lamp Heavy Hydrogen Lamp | 110 200 | 2.0 |
| 37 | $H_2(50)$ $CH_3COCH_3(1)$ $C_2H_6(20)$ | 0.02 | 650 | 20 | Mercury Lamp Heavy Hydrogen Lamp | 110 200 | 0.3 |
| 38 | $H_2(50)$ $CH_3COCH_3(5)$ $C_2H_4(30)$ | 0.1 | 750 | 5 | Mercury Lamp Heavy Hydrogen Lamp | 110 200 | 1.6 |
| 39 | $H_2(100)$ $CH_3COC_2H_5(2)$ $Hg(0.1)$ | 0.02 | 650 | 100 | Mercury Lamp Xenon Lamp | 110 350 | 3.1 |
| 40 | $H_2(50)$ $CH_3OH(3)$ $Hg(0.05)$ | 0.06 | 700 | 20 | Mercury Lamp Xenon Lamp | 110 350 | 2.5 |
| 41 | $H_2(50)$ $CH_3CHO(2)$ $Hg(0.05)$ | 0.04 | 650 | 760 | Mercury Lamp Xenon Lamp | 110 350 | 4.6 |
| 42 | $H_2(50)$ | | | | Mercury Lamp | 110 | |

TABLE 3-continued

| Sample No. | Kinds and Flow Rates of Gases | Production Conditions | | | | Results |
|---|---|---|---|---|---|---|
| | | Volume Proportion of Organic Compound Gases to Hydrogen Gas | Substrate Temperature (°C.) | Pressure of Reaction Gases (Torr) | Kind of Light Source or Light | Power of Light Source (W) | Deposition Speed of Diamond ($\mu$m/hr) |
| | $(CH_3)_2CHOH(3)$ Hg(0.05) | 0.06 | 650 | 10 | Xenon Lamp | 350 | 2.7 |
| 43 | $H_2(100)$ $[(CH_3)_3CO]_2(2)$ Hg(0.1) | 0.02 | 600 | 760 | Mercury Lamp Xenon Lamp | 110 350 | 3.6 |
| 44 | $H_2(100)$ $CH_3CHO(2)$ Xe(3) | 0.02 | 650 | 5 | Mercury Lamp Heavy Hydrogen Lamp | 110 200 | 1.6 |
| 45 | $H_2(100)$ $(CH_3)_2CHOH(3)$ Xe(3) | 0.03 | 700 | 20 | Mercury Lamp Heavy Hydrogen Lamp | 110 200 | 1.6 |
| 46 | $H_2(100)$ $[(CH_3)_3CO]_2(2)$ Xe(3) | 0.02 | 750 | 200 | Mercury Lamp Heavy Hydrogen Lamp | 110 200 | 2.5 |
| 47 | $H_2(100)$ $CH_3NH_2(5)$ Hg(0.1) | 0.05 | 750 | 100 | Mercury Lamp Xenon Lamp | 110 350 | 2.0 |
| 48 | $H_2(100)$ $(CH_3)_3N(3)$ Hg(0.1) | 0.03 | 700 | 50 | Mercury Lamp Xenon Lamp | 110 350 | 3.1 |
| 49 | $H_2(100)$ $(CH_3N_2)(4)$ Hg(0.1) | 0.04 | 650 | 760 | Mercury Lamp Xenon Lamp | 110 350 | 4.7 |
| 50 | $H_2(100)$ $CH_3CONH_2(1)$ Hg(0.1) | 0.01 | 650 | 30 | Mercury Lamp Xenon Lamp | 110 350 | 1.8 |
| 51 | $H_2(100)$ $CH_3NO_2(2)$ Hg(0.1) | 0.02 | 650 | 10 | Mercury Lamp Xenon Lamp | 110 350 | 1.2 |

EXAMPLE 13

A surface-polished silicon wafer was admitted in an electric discharging apparatus provided with opposing targets, and the growth of diamond was carried out for one hour under the conditions described below. The substrate 5 is shown in FIG. 4 and the conditions for producing diamond are shown in Table 4.

TABLE 4

| Sample No. | Discharge | Production Conditions | | | | Results |
|---|---|---|---|---|---|---|
| | | Kinds of and Flow Rates of Gases | Volume Proportion of Orgainc Compound Gases to Hydrogen Gas | Substrate Temperature (°C.) | Pressure of Reaction Gases (Torr) | Power Density (W/cm$^2$) | Deposition Speed of Diamond ($\mu$m/hr) |
| 52 | Direct Current Glow Discharge | $H_2(100)$ $CH_3COCH_3(2)$ | 0.02 | 750 | 20 | 30 | 14 |
| 53 | Direct Current Glow Discharge | $H_2(100)$ $C_2H_5OH(1)$ | 0.01 | 700 | 5 | 20 | 15 |
| 54 | Direct Current Glow Discharge | $H_2(100)$ $[(CH_3)_3CO]_2(1)$ | 0.01 | 700 | 10 | 50 | 18 |
| 55 | Direct Current Glow Discharge | $H_2(100)$ $(CH_3)_3N(1)$ | 0.01 | 750 | 10 | 30 | 12 |
| 56 | Direct Current Arc Discharge | $H_2(100)$ $CH_3COCH_3(1)$ | 0.01 | 750 | 760 | 1500 | 35 |
| 57 | Direct Current Arc Discharge | $H_2(100)$ $CH_3CHO(1)$ | 0.01 | 750 | 200 | 300 | 30 |
| 58 | Direct Current Arc Discharge | $H_2(100)$ $[(CH_3)_3CO]_2(1)$ | 0.01 | 750 | 800 | 1700 | 42 |
| 59 | Direct Current Arc Discharge | $H_2(100)$ $(CH_3)_3NH(1)$ | 0.01 | 650 | 760 | 1500 | 27 |
| 60 | Alternating Current Arc Discharge | $H_2(100)$ $CH_3COCH_3(1)$ | 0.01 | 700 | 760 | 1000 | 31 |
| 61 | Alternating Current Arc Discharge | $H_2(100)$ $CH_3OH(2)$ | 0.02 | 750 | 760 | 900 | 23 |
| 62 | Alternating Current Arc Discharge | $H_2(100)$ $C_2H_5OC_2H_5(1)$ | 0.01 | 600 | 760 | 1000 | 29 |
| 63 | Alternating Current Arc Discharge | $H_2(100)$ $[(CH_3)_3CO]_2(1)$ | 0.01 | 650 | 760 | 1000 | 40 |
| 64 | Alternating Current Arc | $H_2(100)$ $(CH_3)_3N(1)$ | 0.01 | 650 | 760 | 1200 | 25 |

TABLE 4-continued

| Sample No. | Discharge Discharge | Production Conditions | | | | | Results |
|---|---|---|---|---|---|---|---|
| | | Kinds of and Flow Rates of Gases | Volume Proportion of Orgainc Compound Gases to Hydrogen Gas | Substrate Temperature (°C.) | Pressure of Reaction Gases (Torr) | Power Density (W/cm$^2$) | Deposition Speed of Diamond (μm/hr) |

CAPABILITY OF EXPLOITATION IN INDUSTRY

As is apparent from the foregoing description, the following prominent effects can be attained according to the present invention.

(a) Since the number of kinds of starting gases that can be used in the present invention is much larger than in the conventional methods, the present invention is very advantageous from the practical viewpoint.

(b) Continuous production is possible and the apparatus and starting material costs are very cheap.

(c) Since the range of the synthesis conditions is broad, the synthesis can be carried out very easily.

(d) The speed of deposition of diamond is several times to scores of times as high as the precipitation speeds in the conventional methods, and granular or filmy diamond having a high quality can be obtained.

I claim:

1. A synthesizing process for diamond by a chemical vapor phase growth method, characterized by converting an organic compound containing carbon, hydrogen and at least one of oxygen and nitrogen, to a gas phase, mixing the gas with hydrogen gas, decomposing the mixed gas by an energy of heat, electron beam, light, direct current glow discharge, alternating current glow discharge, or direct current arc discharge, and introducing the decomposed gas to the surface of a heated substrate to deposit diamond on the surface of the substrate.

2. A synthesizing process according to claim 1, wherein the heat for said decomposition is generated by a heater heated to a temperature of from 1500° C. to 2800° C.

3. A synthesizing process according to claim 1, wherein the electron beam for said decomposition has a current density of not less than 1 mA/cm$^2$.

4. A synthesizing process according to claim 1, wherein the light for decomposition has a wavelength of not more than 600 nm.

5. A synthesizing process according to claim 1, wherein the electric discharge for said decomposition is carried out at a power density of not less than 1 W/cm$^2$.

6. A synthesizing process according to any one of claims 1 through 5, wherein the pressure of a reaction tube, in which said decomposition is carried out, is from 0.01 to 1000 Torr.

* * * * *